United States Patent
Schaper et al.

(10) Patent No.: US 11,009,557 B2
(45) Date of Patent: May 18, 2021

(54) METHOD AND DEVICE FOR SHORT-CIRCUIT MONITORING OF A THREE-PHASE LOAD

(71) Applicant: Phoenix Contact GmbH & Co. KG, Blomberg (DE)

(72) Inventors: Elmar Schaper, Lügde (DE); Daniel Hawel, Detmold (DE); Detlev Schuergens, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 161 days.

(21) Appl. No.: 16/070,212

(22) PCT Filed: Jan. 13, 2017

(86) PCT No.: PCT/EP2017/050658
§ 371 (c)(1),
(2) Date: Jul. 13, 2018

(87) PCT Pub. No.: WO2017/121846
PCT Pub. Date: Jul. 20, 2017

(65) Prior Publication Data
US 2019/0033361 A1 Jan. 31, 2019

(30) Foreign Application Priority Data
Jan. 15, 2016 (DE) .................... 10 2016 100 671.8

(51) Int. Cl.
*G01R 31/50* (2020.01)
*G01R 19/00* (2006.01)
*G01R 31/42* (2006.01)

(52) U.S. Cl.
CPC ......... *G01R 31/50* (2020.01); *G01R 19/0092* (2013.01); *G01R 31/42* (2013.01)

(58) Field of Classification Search
CPC .... G01R 31/42; G01R 19/0092; G01R 31/50; G01R 31/388; H03K 7/08; A61N 1/36036; A61N 1/378
(Continued)

(56) References Cited

U.S. PATENT DOCUMENTS 5,524,480 A * 6/1996 Schlienz ................. F02B 75/06
  73/114.03
2006/0007619 A1 1/2006 Scott et al.
(Continued)

FOREIGN PATENT DOCUMENTS

DE 4111831 A1 10/1992
DE 19954950 A1 5/2001
(Continued)

OTHER PUBLICATIONS

Office Action issued in counterpart German patent application No. 102016100671.8, dated Jul. 26, 2016.
(Continued)

*Primary Examiner* — Melissa J Koval
*Assistant Examiner* — Trung Q Nguyen
(74) *Attorney, Agent, or Firm* — Kaplan Breyer Schwarz, LLP

(57) ABSTRACT

A method and device for short circuit monitoring of a three-phase load connected to a three-phase grid, to improve short circuit monitoring of a three-phase load, the device having at least one current sensor arranged in the current path of one phase of the three-phase grid, and a processing unit for evaluating the measurement values of the at least one current sensor, having a respective port for each current sensor, to which the respective current sensor is connected via a connecting line. The processing unit is configured to detect a short circuit on the three-phase load through evaluation of the measurement values determined by the current
(Continued)

sensor. The evaluation includes a plausibility check of the determined measurement values in order to distinguish between a short circuit and an influence on the determined measurement values by electrical and/or electromagnetic interference.

18 Claims, 2 Drawing Sheets

(58) Field of Classification Search
USPC ....... 324/326, 337, 379, 323, 500, 512, 528, 324/66, 250, 754.06, 754.31, 631, 637, 324/645, 76.12, 76.14, 76.56, 84, 95
See application file for complete search history.

(56) References Cited

U.S. PATENT DOCUMENTS

| | | | |
|---|---|---|---|
| 2016/0054421 A1* | 2/2016 | Horstmann | G01R 31/50 324/537 |
| 2019/0128942 A1* | 5/2019 | Luebke | G01R 31/025 |

FOREIGN PATENT DOCUMENTS

| | | |
|---|---|---|
| DE | 102011001340 A1 | 9/2012 |
| DE | 102014106130 A1 | 11/2015 |
| IE | 4142471 A1 | 7/1992 |
| IE | 4329919 A1 | 3/1995 |
| JP | 2014-512789 A | 5/2014 |
| JP | 2014-135879 A | 7/2014 |

OTHER PUBLICATIONS

International Search Report issued in counterpart PCT application No. PCT/EP2017/050658, dated Mar. 27, 2017, Authorized Officer: Jedlickska, István.

English Translation of the International Search Report issued in counterpart PCT application No. PCT/EP2017/050658, dated Mar. 27, 2017, Authorized Officer: Jedlickska, István.

Office Action issued in counterpart Japanese patent application No. 2018-536464, dated Jun. 27, 2019, 6 pp.

Authorized Officer: Nora Lindner, English Translation of "International Preliminary Report on Patentability", dated Jul. 26, 2018, 8 pp.

English Translation of Office Action issued in counterpart German patent application No. 102016100671.8, dated Jul. 26, 2016.

* cited by examiner

METHOD AND DEVICE FOR SHORT-CIRCUIT MONITORING OF A THREE-PHASE LOAD

FIELD

The invention generally relates to three-phase systems and more particularly to a device and a method for short circuit monitoring of a three-phase load.

BACKGROUND

In three-phase systems, also known as three-phase alternating current systems, a three-phase load operated on the three-phase system, such as a motor, a heating element, or a lamp, requires short circuit monitoring for reasons of electrical safety.

Usually, for this purpose, current sensors are used to monitor the amperage in the current paths connecting the three-phase load to the conductors of the three-phase grid, and a short circuit on the three-phase load is noticeable by sudden jump-type changes in the measured amperage.

AC sensors, also referred to as current transformers, usually consist of a toroidal core and are configured like a transformer. The alternating magnetic field of a conductor which carries the alternating current to be detected induces an alternating current in the measuring coil, which is proportional to the measured amperage, via the reciprocal ratio of turns.

Current sensors in three-phase applications thus provide a proportional image of the input signal, with the operating principle of the converter being based on a Rogowski coil, a Hall sensor, or a transformer, for example. Also, current clamps configured for alternating current and having large openings are known, for example, which can be clamped around the current conductor to be measured.

By appropriately choosing the ratio of turns of the coils involved, a large measurement range can be covered without appreciably affecting the primary circuit. Current transformers based on this principle usually do not require any external power for operation.

For short circuit monitoring in three-phase applications using current sensors, the amperage data are usually first acquired as analog values. The waveform of the detected current data is checked for possible jump-type changes that indicate a short circuit, for example by a device for monitoring the motor current.

From DE 10 2011 001340 A1, for example, an electrical device is known for short circuit protection of a three-phase load in a three-phase system, in which a means for detecting a short circuit is provided on the three-phase load, the means for detecting a short circuit comprising a current sensor, and a means for identifying a switching threshold, which is configured so as to detect a short circuit when a predefined switching threshold is exceeded.

The output signal of the sensors may be affected by electrical and/or electromagnetic interference. Especially current sensors which are dimensioned for short circuit currents have the property of providing a signal which is similar to an interference, due to the high rise rates of the useful signal.

Switching operations in the three-phase system might affect the output signal of the current sensors by introducing magnetic or electrical interference. A device for short circuit monitoring is typically operated with an operating voltage of 24 V, for example, while the voltage between two conductors of the three-phase grid is about 400 V. These voltage differentials, but also the coupling capacity of the lines and parallel routing of the lines play a crucial role for the introduction of interference. The interfering current that causes the interference is usually fed to the device via cables and introduced through device interfaces. The interfering current may flow through parasitic capacitances as well as via cable shielding capacitances. It easily reaches the interior of the device via galvanic connections. A few picofarad of parasitic coupling capacity of galvanically separating interfaces are sufficient.

From DE 43 29 919 A1, a method and a device are known for operating a power consumer in a vehicle, the device comprising switching elements, and the current is detected by each switching element and individually monitored for reaching or exceeding a predetermined maximum value. If a short circuit would be assumed in the vicinity of the power consumer and a shutdown effected at each such exceedance event, a shutdown would also be caused in the event of an interference caused by interfering radiation, for example. In order to avoid shutdown of the device upon each such short-term interference, a timer is started when the maximum current is exceeded, and an error is only detected when this exceedance persists for a predetermined time.

A drawback of the method described in DE 43 29 919 A1 is that a short circuit is detected with a time delay and that false detection can only be avoided in the case of short-term interferences.

The present invention is therefore based on the object to provide a way for improved short circuit monitoring of a three-phase load.

SUMMARY

This object is achieved by the features of the independent claims. Advantageous embodiments are specified by the dependent claims.

Accordingly, a device for short circuit monitoring of a three-phase load connected to a three-phase grid comprises at least one current sensor arranged in the current path of one phase of the three-phase grid, a processing unit for evaluating the measurement values of the at least one current sensor, which has a respective port for each current sensor to which the respective current sensor is connected via a connecting line, wherein the processing unit is adapted to detect a short circuit on the three-phase load through evaluation of the measurement values determined by the current sensor, and wherein the evaluation comprises a plausibility check of the determined measurement values in order to distinguish between a short circuit and an influence on the determined measurement values by electrical and/or electromagnetic interference.

Particularly advantageously, the current is measured in the current path of a plurality of or all phases of the three-phase grid, for the purpose of short circuit monitoring.

Accordingly, the device preferably comprises a plurality of current sensors, in particular three, which are each arranged in the current path of a different phase of the three-phase grid and are each connected to associated ports of the processing unit via connecting lines. In other words, particularly advantageously in this embodiment, each current path has a current sensor of the short circuit monitoring device arranged therein.

According to a particularly advantageous embodiment of the device it is contemplated that at least two of the connecting lines connecting the current sensors to the processing unit are interconnected to each other via a coupling element. Particularly advantageously, all connecting lines connecting the current sensors to the processing unit are interconnected to each other in respective pairs, via separate coupling elements.

The coupling elements in particular imply a capacitive coupling between the connecting lines and therefore advantageously each comprise at least one capacitor.

The coupling elements in particular serve to uniformly distribute, to the connecting lines, electrical and/or electromagnetic interferences which are introduced into the short circuit monitoring device, so as to cause the voltage level caused by an interference to be leveled out at all ports of the processing unit to which current sensors are connected, regardless from which direction and into which connecting line the interference is introduced.

The useful signals of the current sensors, i.e. the measurement signals of the current measurement, by contrast, should not be affected by the coupling elements. The coupling elements are therefore particularly advantageously designed as a respective high-pass such that the connecting lines are substantially short-circuited for high-frequency signals, while measurement signals of the current sensors transmitted on the connecting lines remain substantially unaffected by the coupling elements. In particular, the coupling elements are tuned such that useful signals having a frequency of 50 Hz are not affected.

For the purpose of short circuit monitoring, the device is preferably adapted to determine current measurement values using current sensors, continuously or at predetermined time intervals, in particular cyclically. The evaluation, by the processing unit, of the measurement values acquired by the current sensors advantageously includes an evaluation of the time profile of the determined measurement values in order to detect in particular jump-type changes in the signal profile.

Preferably, the processing unit is adapted to detect a short circuit when at least one determined current value or a value derived from a plurality of determined current values exceeds a predetermined threshold and the determined current values meet predetermined plausibility rules.

In an advantageous embodiment, the processing unit is adapted to determine, as the derived values, the maximum amplitudes of the positive and negative half-waves of the current waveform during a predetermined measurement duration.

It should be noted that the processing unit may be adapted to directly process the analog measurement signals acquired by the current sensors using an appropriate analog circuit arrangement, or to convert the measurement signals into digital data and to evaluate them using a microcontroller, for example.

A key idea of the invention is to perform a plausibility check on the acquired measurement values when evaluating the detected measurement signals of the current sensors, in order to distinguish between a short circuit and an influence on the determined measurement values by electrical and/or electromagnetic interference.

In an advantageous embodiment, a plausibility rule to be met contemplates, for example, that the current values as determined by the current sensors must not all have the same sign at a given time. Depending on the applied three-phase load and on interferences that are to be expected, further suitable plausibility rules can be defined.

Preferably, the device comprises a control output for providing a control signal when a short circuit is detected by the processing unit, in order to initiate appropriate measures upon detection of a short circuit, such as to cause a safe shutdown of the three-phase load.

The object is furthermore achieved by a method for short circuit monitoring of a three-phase load that is connected to a three-phase grid, which comprises determining measurement values using at least one current sensor that is arranged in the current path of one phase of the three-phase grid, and evaluating the determined measurement values or values derived therefrom by a processing unit in order to detect a short circuit, wherein the evaluating comprises a plausibility check of the determined measurement values in order to distinguish between a short circuit and an influence on the determined measurement values by electrical and/or electromagnetic interference.

The method provides advantageous embodiments in analogy to the advantageous embodiments of the device described above.

Accordingly, the method advantageously contemplates that the determining of the measurement values is achieved using a plurality of current sensors, in particular three, which are each arranged in the current path of a different phase of the three-phase grid and which are each connected to associated ports of the processing unit via respective connecting lines, wherein in particular at least two of the connecting lines connecting the current sensors to the processing unit are interconnected to each other via a coupling element, and wherein, particularly advantageously, all connecting lines connecting the current sensors to the processing unit are interconnected to each other in pairs, via separate coupling elements.

The determining of the measurement values is preferably performed continuously or at predetermined time intervals, in particular cyclically, and the evaluating by the processing unit preferably comprises evaluating the time profile of the determined measurement values.

The processing unit will in particular detect a short circuit when at least one determined current value or a value derived from a plurality of determined current values exceeds a predetermined threshold and the determined current values meet predefined plausibility rules, wherein a plausibility rule to be met, for example, defines that the current values determined by the current sensors must not all have the same sign at a given time.

Furthermore, the method advantageously contemplates that upon detection of a short circuit by the processing unit, a control signal is generated. Advantageously, the method contemplates that an action is caused by the control signal, for example displaying of an error information, forwarding of an error message, or a safe shutdown of the three-phase load.

BRIEF DESCRIPTION OF THE DRAWINGS

The invention will now be explained in more detail by way of some exemplary embodiments in conjunction with the drawings, wherein the same reference numerals designate the same or similar components, and wherein.

DETAILED DESCRIPTION

Figure 1:
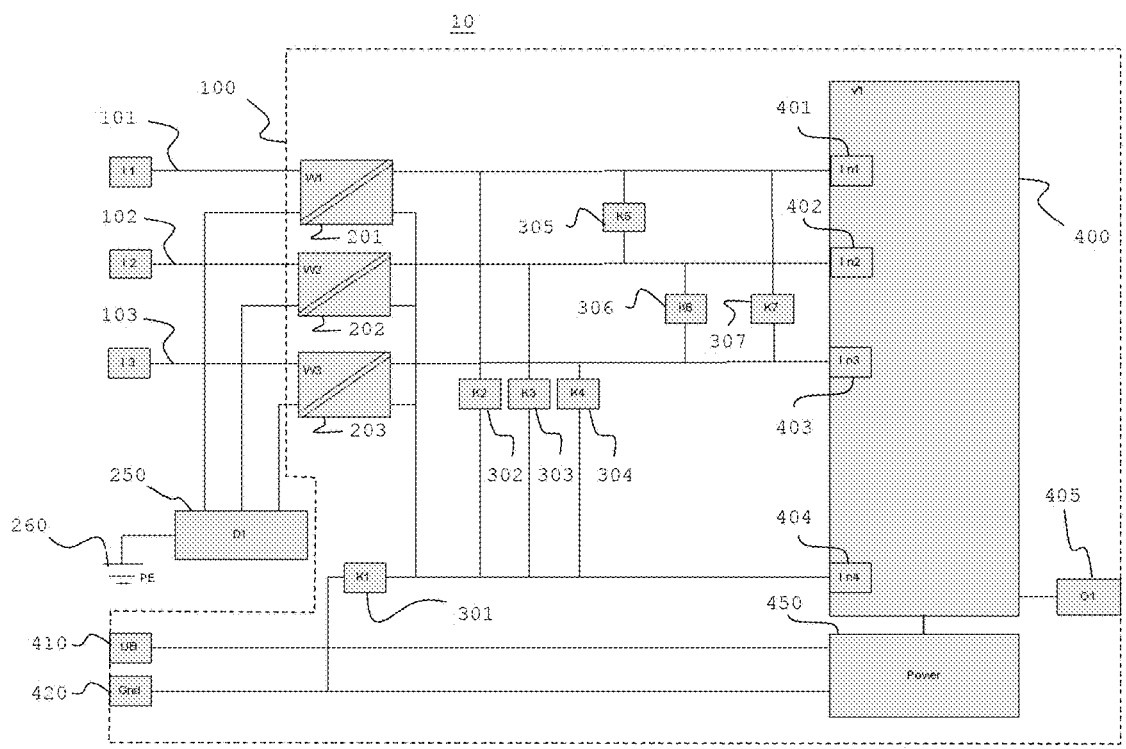
FIG. 1 schematically illustrates a preferred embodiment of a device according to the invention for short circuit monitoring of a three-phase load.

FIG. 1 shows a three-phase system 10 in which a three-phase load 250 is connected to the conductors of a three-phase grid, not shown in FIG. 1, via current paths 101, 102, and 103, with a current flowing through each of the current paths, as indicated by labels I1, I2, and I3 in FIG. 1.

Three-phase load 250 may be operated in a star or delta connection, for example. In the illustrated exemplary embodiment, the three-phase load 250 is operated in a star connection, with the star bridge being at potential N and being connected to the protective earth 260.

A device 100 is provided for short circuit monitoring of the three-phase load 250 connected to the three-phase grid, the device comprising three current sensors 201, 202, and 203 arranged in a respective current path of the phase of the three-phase grid, and a processing unit 400 is provided for evaluating the measurement values of the current sensors 201, 202, and 203, which has a respective port 401, 402, and 403 for each of the current sensors, to which the respective current sensor is connected via a connecting line. Furthermore, a shared reference port 404 of the processing unit 400 is provided for the current sensors.

The voltage applied between any one of ports 401, 402, or 403 and reference port 404 is proportional to the amperage measured by the respective current sensor 201, 202, or 203. Current sensors 201-203 are in particular provided in the form of current transformers. However, any known or future type of suitable current sensor can be used in principle.

The connecting lines connecting the current sensors 201, 202, and 203 to ports 401, 402 and 403, respectively, are interconnected to each other in pairs, via coupling elements 305, 306, and 307. Furthermore, in the illustrated exemplary embodiment, the connecting lines connecting the current sensors 201, 202, and 203 to ports 401, 402, and 403 are each connected to that connecting line which connects the current sensors 201, 202, and 203 to the reference port 404, via coupling elements 302, 303, and 304, respectively.

Device 100 further comprises ports 410 and 420 for connecting the device 100 to a supply voltage, which are connected to a power supply unit 450 in the illustrated exemplary embodiment, which supplies the processing unit 400 with electrical energy, and wherein connection 420 is configured as a ground connection.

In the illustrated exemplary embodiment, the connecting line connecting the current sensors 201, 202, and 203 to the reference port 404 is connected to the ground connection 420 via a further coupling element.

Coupling elements 301-307 in particular provide a capacitive coupling between the connecting lines and, accordingly, each advantageously comprise at least one capacitor. Coupling elements 301-307 in particular serve to uniformly distribute, to the connecting lines, electrical and/or electromagnetic interference that is introduced into the device 100, so as to equal out, at all ports 401-404 of the processing unit to which the current sensors 201-203 are connected, the voltage level as caused by an interference, regardless from which direction and on which connecting line the interference is introduced.

The processing unit 400 is configured for detecting a short circuit on the three-phase load through an evaluation of the measurement values determined by the current sensors 201, 202, and 203, and the evaluation comprises a plausibility check of the determined measurement values so as to distinguish between a short circuit and an influence on the determined measurement values by electrical and/or electromagnetic interference.

The device further has a control output 405 for providing a control signal by the processing unit 400 upon detection of a short circuit.

Figure 2:
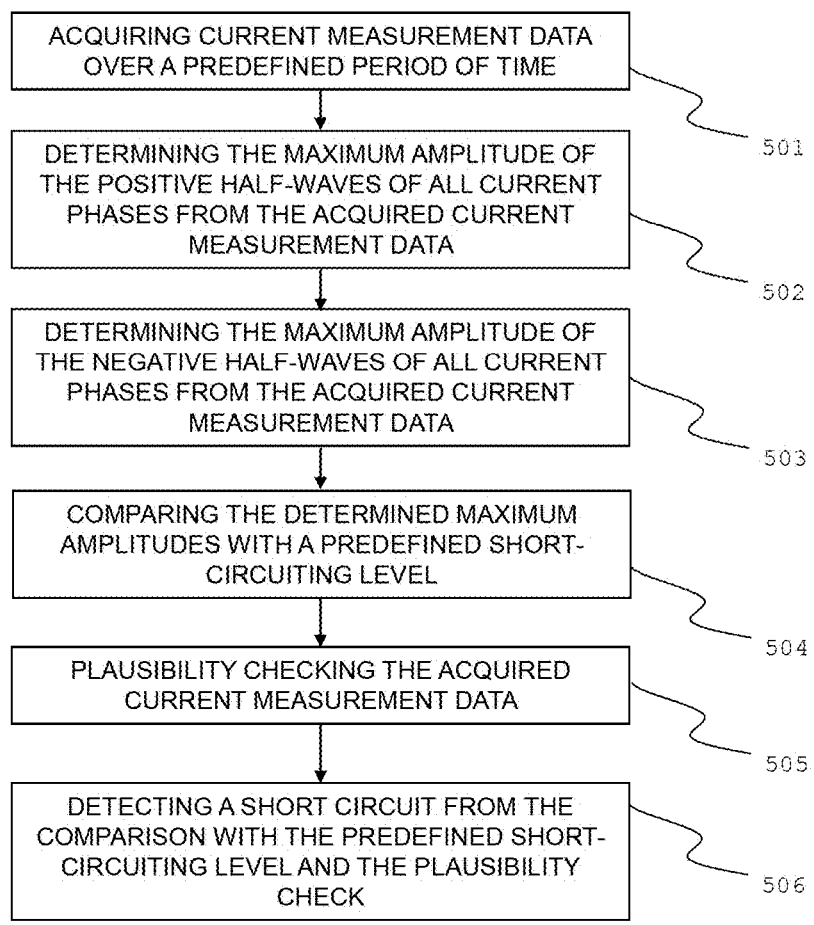
FIG. 2 schematically shows the steps of a preferred embodiment of a method according to the invention for short circuit monitoring of a three-phase load.

FIG. 2 schematically shows the steps of a preferred embodiment of a method according to the invention for short circuit monitoring of a three-phase load.

In step 501, current measurement data are acquired over a predetermined period of time, by current sensors 201, 202, and 203. In step 502 the maximum amplitudes of the positive half-waves of all current phases are determined from the acquired current measurement data, and in step 503 the maximum amplitudes of the negative half-waves of all current phases. In step 504, the determined maximum amplitudes are each compared with a predefined short-circuiting level, and in step 505 a plausibility check is performed on the detected current measurement data. In step 506, the detection of a short circuit is then accomplished based on the result of the comparison of the respective determined maximum amplitudes with the predefined short-circuiting level and depending on the result of the plausibility check, and a short circuit is detected when one of the determined maximum amplitudes exceeds the short-circuiting level and the plausibility rules defined for the plausibility check are met, that is, for example, that not all current measurement values have the same sign at a given measurement time, since the latter would indicate that the short-circuiting level is exceeded not due to a short circuit but due to an interference.

The invention thus provides a measurement method and a directly indicating measurement system that takes into account, in its measurement parameters, the electromagnetic compatibility (EMC) behavior of the measurement object, thereby detecting the interference effects or measurement signals as accurately as possible and without feedback and considering a kind of "friend or foe" detection in the event of an fault.

Experience has shown that without the coupling elements 301-307 it would be difficult to derive, from the time profile of the measurement values, the decision as to whether a device experiences interference or not.

The invention advantageously contemplates to intentionally couple, by means of hardware, electrical and/or electromagnetic interference between the circuits, so that at any time the same interference-induced voltage conditions will be resulting at the ports 401, 402, and 403.

Especially in the case of steeply rising useful signals, there is barely time for the short circuit current sensor and the processing to distinguish between the useful signal and an electrical and/or electromagnetic interference.

The device 100 described above is capable of detecting excessive interferences affecting the nominal operation of the device and the circuit and of preventing further processing thereof and triggering of a monitoring threshold via the control output 405 or a response of the system.

The processing unit 400 continuously checks the data and the signal profile for possible jump-like changes in view of a short circuit. A short circuit in particular exists when the determined deviation of the maximum amplitude of the instantaneous amperage data exceeds a predefined threshold and the plausibility check reveals that not all current data are in the positive or the negative half-wave.

Advantageously, the event "short circuit" is triggered when a short circuit is detected in a successive series of current data or readings.

With the plausibility check, signals are checked for correct timing. For example, the three currents in the three-phase system will never exhibit proportional analog signals with the same sign. The plausibility check clearly distinguishes useful signals from electrical or electromagnetic interference.

LIST OF REFERENCE NUMERALS

10 Three-phase system
100 Device for short circuit monitoring
101-103 Current paths
201-203 Current transformer
250 Three-phase load
260 Protective earth
301-307 Coupling elements
400 Processing unit
401-403 Ports for analog current measurement signals
404 Port for analog reference signal
405 Output
410, 420 Ports for supply voltage
450 Power supply unit
501-505 Method steps

The invention claimed is:

1. A device for short circuit monitoring of a three-phase load connected to a three-phase grid, comprising:
 a plurality of current sensors, each of which is arranged in the current path of a different phase of the three-phase grid;
 a processing unit for evaluating the measurement values of the current sensors, having a respective port for each current sensor to which the respective current sensor is connected via a connecting line, wherein the processing unit is adapted to detect a short circuit on the three-phase load through evaluation of the measurement values determined by the current sensors, wherein said evaluation comprises a plausibility check of the determined measurement values for distinguishing between a short circuit and an influence on the determined measurement values by electrical and/or electromagnetic interference, and wherein at least two of the connecting lines connecting the current sensors to the processing unit are interconnected to each other via a coupling element.

2. The device as claimed in claim 1, comprising three of the current sensors, each of which is arranged in the current path of a different phase of the three-phase grid and is connected to a respective associated port of the processing unit via a respective connecting line.

3. The device as claimed in claim 1, wherein the connecting lines connecting the current sensors to the processing unit are interconnected to each other in pairs via separate coupling elements.

4. The device as claimed in claim 1, wherein each of the coupling elements is configured as a high-pass, such that the connecting lines are substantially short-circuited for high-frequency signals, while measurement signals of the current sensors transmitted on the connecting lines remain substantially unaffected by the coupling elements.

5. The device as claimed in claim 1, which, for the purpose of short circuit monitoring, is adapted to determine current measurement values continuously or at predetermined time intervals, in particular cyclically, using the current sensors.

6. The device as claimed in claim 1, wherein the evaluation by the processing unit comprises an evaluation of the time profile of the determined measurement values.

7. The device as claimed in claim 1, wherein the processing unit is adapted to detect a short circuit when at least one determined current value or a value derived from a plurality of determined current values exceeds a predefined threshold and the determined current values meet predefined plausibility rules.

8. The device as claimed in claim 1, wherein a plausibility rule to be met defines that the current values determined by the current sensors must not all have the same sign at a given time.

9. The device as claimed in claim 1, comprising a control output for providing a control signal upon detection of a short circuit by the processing unit.

10. A method for short circuit monitoring of a three-phase load connected to a three-phase grid, comprising the steps of:
 determining measurement values using a plurality of current sensors, each of which is arranged in the current path of a different phase of the three-phase grid, and each of which is connected via a connecting line to a respective port of a processing unit, wherein at least two of the connecting lines connecting the current sensors to the processing unit are interconnected to each other via a coupling element;
 evaluating the determined measurement values or values derived therefrom, by the processing unit to which the current sensors are connected, for detecting a short circuit, wherein said evaluating comprises a plausibility check of the determined measurement values in order to distinguish between a short circuit and an influence on the determined measurement values by electrical and/or electromagnetic interference.

11. The method as claimed in claim 10, wherein the determining of the measurement values is performed using three of the current sensors, each of which is arranged in the current path of a different phase of the three-phase grid and is connected to a respective associated port of the processing unit via a respective connecting line.

12. The method as claimed in claim 10, wherein the connecting lines connecting the current sensors to the processing unit are interconnected to each other in pairs via separate coupling elements.

13. The method as claimed in claim 10, wherein each of the coupling elements is configured as a high-pass, such that the connecting lines are substantially short-circuited for high-frequency signals, while measurement signals of the current sensors transmitted on the connecting lines remain substantially unaffected by the coupling elements.

14. The method as claimed in claim 10, wherein the determining of measurement values is performed continuously or at predetermined time intervals, in particular cyclically.

15. The method as claimed in claim 10, wherein the evaluating by the processing unit comprises evaluating the time profile of the determined measurement values.

16. The method as claimed in claim 10, wherein a short circuit is detected by the processing unit when at least one determined current value or a value derived from a plurality of determined current values exceeds a predefined threshold and the determined current values meet predefined plausibility rules.

17. The method as claimed in claim 10, wherein a plausibility rule to be met defines that the current values determined by the current sensors must not all have the same sign at a given time.

18. The method as claimed in claim 10, wherein upon detection of a short circuit by the processing unit, a control signal is generated.

* * * * *